(12) United States Patent
Singh et al.

(10) Patent No.: US 6,452,418 B1
(45) Date of Patent: Sep. 17, 2002

(54) LEVEL SHIFTER WITH INDEPENDENT GROUNDS AND IMPROVED EME-ISOLATION

(75) Inventors: Balwinder Singh, Union City; Klaas-Jan De Langen, Sunnyvale; Martijn Bredius, San Jose, all of CA (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/894,390

(22) Filed: Jun. 28, 2001

(51) Int. Cl.[7] ............................................. H03K 19/084
(52) U.S. Cl. ............................ 326/68; 326/81; 326/83
(58) Field of Search ............................. 326/26, 27, 63, 326/68, 80, 81, 83, 86

(56) References Cited

U.S. PATENT DOCUMENTS 6,255,857 B1 * 7/2001 Iliasevitch .................. 326/124
6,154,061 A1   11/2001 Boezen et al.
6,339,355 B1 * 1/2002 Yamauchi et al. .......... 327/103

* cited by examiner

*Primary Examiner*—Michael Tokar
*Assistant Examiner*—Don Phu Le
(74) *Attorney, Agent, or Firm*—Michael Schmitt

(57) ABSTRACT

A driving circuit provides a symmetric differential driving signal relative to one set of voltage potentials to a driver circuit that drives an output node to another set of voltage potentials. The differential driving signals from the driving system are equal and opposite to each other, thereby avoiding stray current flow between the driving system and the driven current mirrors. The transistors that provide the driving signal are continuously biased, using a weak bias in one logic state and stronger bias in the other state, to avoid hard-switching transients.

13 Claims, 1 Drawing Sheet

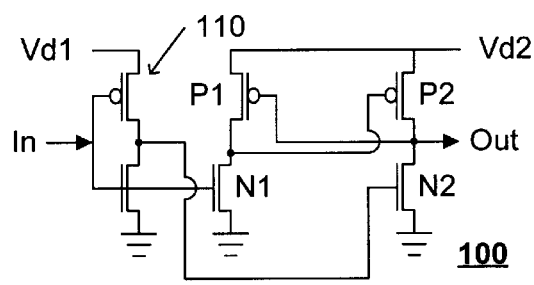
FIG. 1 [Prior Art]
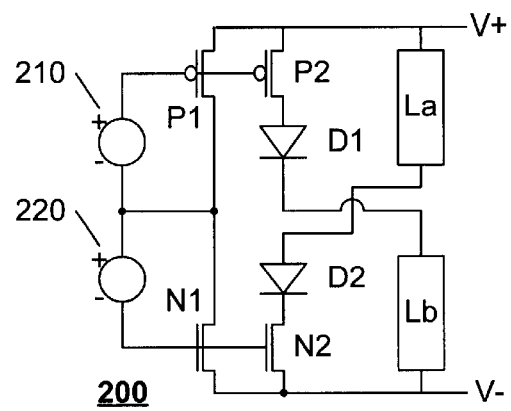
FIG. 2 [Prior Art]
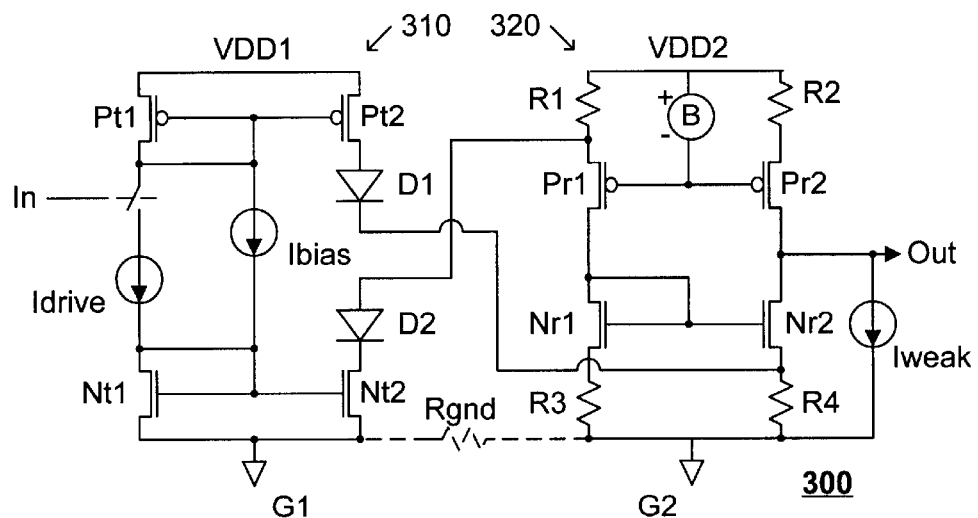
FIG. 3

LEVEL SHIFTER WITH INDEPENDENT GROUNDS AND IMPROVED EME-ISOLATION

BACKGROUND OF THE INVENTION

1. Field of the Invention

This invention relates to the field of electronic circuits, and in particular to a level shifter with independent ground potentials, and reduced electromagnetic emissions (EME).

2. Description of Related Art

Level shifters are commonly used to provide communication of signals from a system having a first range of voltage potential to another system having a different range of voltage potential. For example, level shifters are commonly used in automotive applications, because typical automobile systems operate at 0–18 volts, whereas common integrated circuits typically operate at 0–3 volts, or 0–5 volts. An asserted "logic-high" three or five volt output from an integrated circuit may be insufficient to be interpreted as a logic-high in a twelve volt system. A level shifter provides the appropriate mapping of voltage levels from one system to another, to ensure the proper communication of logic values.

FIG. 1 illustrates an example schematic of a conventional level shifter 100 that is configured to provide a logic-high voltage level of Vd2 at its output (Out) corresponding to a logic-high voltage level of Vd1 at its input (In). The logic-low levels of both signal (In, Out) is zero volts. Each of these voltage potentials are referenced with regard to a common ground potential.

When a logic-high (Vd1) input signal is received at the In node, the transistor N1 is turned on. At the same time, the inverter 110 turns transistor N2 off. With transistor N1 turned on, and N2 turned off, transistor P2 is turned on, thereby pulling the Out node to Vd2. In this manner, an input voltage level of Vd1 is converted to an output voltage level of Vd2.

When a logic-low (ground potential) input signal is received, transistor N1 is turned off, and the inverter 110 turns transistor N2 on. With transistor N1 turned off, transistor P2 is turned off, and transistor N2 pulls the Out node to ground potential. In this manner, an input signal at ground potential provides an output signal that is also at ground potential.

Note that the level shifter of FIG. 1 relies on a common ground potential for proper operation. If the ground of the input system (inverter 110) differs from the ground potential of the output system (N1, P1, N2, P2), ground currents will flow. If the difference between ground potentials is significant, the level shifter 100 may fail to operate, or may operate intermittently.

FIG. 2 illustrates an example schematic of a level shifter 200 that is configured to convert signals from floating sources 210, 220 into signals for driving a bus between two potentials, V+, V−, as presented in U.S. Pat. No. 6,154,061, "CAN BUS DRIVER WITH SYMMETRICAL DIFFERENTIAL OUTPUT SIGNALS", issued Nov. 28, 2000 to Hendrik Boezen et al, and incorporated by reference herein. Transistor P2 and diode D1 are configured to drive a bus load Lb to a potential of V+, and transistors N2 and diode D2 are configured to drive a bus load La to a potential of V− and therefore substantially independent of potentials V+ and V− for both logic-high and logic-low signal levels. The level shifter 200 provides equal and opposite currents to the loads La, Lb, thereby avoiding ground currents, and ground bounce as the bus switches state. The output transistors P2 and N2, however, are hard-driven to each corresponding rail voltage, V+ and V−, at each bus state transition, causing substantial electromagnetic emissions (EME).

BRIEF SUMMARY OF THE INVENTION

It is an object of this invention to provide a level shifter that allows for two substantially independent ground voltage potentials. It is a further object of this invention to provide a level shifter that has reduced electromagnetic emissions (EME), compared to the conventional level shifters of FIGS. 1 and 2.

These objects, and others, are achieved by providing a symmetric differential driving signal relative to one set of voltage potentials to a pair of current sources that drive an output node to another set of voltage potentials. The differential driving signals from the driving system are equal and opposite to each other, thereby avoiding stray current flow between the driving system and the driven current mirrors. The transistors that provide the driving signal are continuously biased, using a weak bias in one logic state and stronger bias in the other state, to avoid hard-switching transients.

BRIEF DESCRIPTION OF THE DRAWINGS

The invention is explained in further detail, and by way of example, with reference to the accompanying drawings wherein:

FIG. 1 illustrates an example schematic of a prior art level shifter.

FIG. 2 illustrates an example schematic of a prior art symmetric differential bus driver.

FIG. 3 illustrates an example schematic of a level shifter in accordance with this invention.

DETAILED DESCRIPTION OF THE INVENTION

FIG. 3 illustrates an example schematic of a level shifter 300 in accordance with this invention. For convenience, the level shifter 300 is hereinafter referred to as comprising a transmitting (driving) section 310, and a receiving (driven) section 320. Consistent with this terminology and the prior art, the level shifter 300 may also be referred to as a transceiver. The transmit section 310 is configured to operate with power supply potentials of Vdd1 and G1, and the receive section 320 is configured to operate with power supply potentials of Vdd2 and G2. These two sets of voltage potentials are substantially independent, the relationship between them being symbolized by a virtual resistance Rgnd between the two ground potentials G1 and G2. Note that as used herein, the term ground potential is used merely to identify a potential that a particular system uses as a reference potential, which may or may not be tied to an earth-ground potential, and may in fact be floating relative to any other reference potential.

The transmit section 310 includes transistors Pt1, Pt2, Nt1, and Nt2 that are configured in a current mirror configuration. A current source Ibias is provided to weakly bias the transistors Pt1, Pt2, Nt1, and Nt2. The input signal, In, controls whether or not an additional current source, Idrive, is applied in parallel to the bias current Ibias. The diodes D1 and D2 protect the supplies Vdd1 and Vdd2 from being shorted to ground potentials G2 and G1, respectively.

The receive section 320 includes transistors Pr1 and Pr2 that act as current sources, and transistors Nr1 and Nr2 that are configured as a resitor-ratioed current mirror. The voltage B biases the gates of transistors Pr1 and Pr2.

In the absence of the Idrive current, when the In signal is not asserted (logic-low), the Ibias current is mirrored by the transistors Pt2 and Nt2 to cause current flow through resistors R4 and R1, respectively. The resultant voltage across the resistors R4 and R1 biases Pr1 and Nr2 away from conduction, causing a weak pull-up of the output signal Out toward Vdd2. The current source Iweak is provided to counteract this weak pull-up, and pulls the output signal Out to ground potential G2. Thus, with a non-asserted input signal, the output signal is pulled to a ground potential G2, independent of the reference potentials Vdd1, G1 associated with the input signal.

When the In signal is asserted (logic-high), the Idrive current augments the Ibias current, and this additive current is mirrored by the transistors Pt2 and Nt2, causing more current to flow through resistors R4 and R1, thereby turning transistor Pr2 on, and transistors Pr1, Nr1, and Nr2 off. Because the Iweak current source is weak, the conduction of transistor Pr2 pulls the Out signal to Vdd2. Thus, with an asserted input signal, the output signal is pulled to a source potential Vdd2, independent of the reference potentials Vdd1, G1 associated with the input signal. Because the transistors Pt2 and Nt2 are initially biased by the Ibias current source, the application of the Idrive current source does not introduce a hard switching of the transistors Pt2 and Nt2, thereby reducing EME, relative to the hard-switching EME of the bus driving circuit 200 of FIG. 2.

The current mirror configuration of the transmit section 310 assures that equal currents flow through transistors Pt2 and Nt2. The current flow through Pt2 flows into the receiver 320, and the current flow through Nt2 flows from the receiver 320. This equal and opposite current flow avoids current flow through the ground path Rgnd, thereby minimizing ground bounce and hence minimizing EME.

Note that, if the potential difference between G1 and G2 is very large, some pull-up or pull-down current through Rgnd will occur. In such cases, the level-shifting function of the level shifter 300 will continue to operate properly, albeit with some ground-bounce induced EME. The level shifter 300 can operate at high speeds, can tolerate large ground offsets, and has a large common-mode range.

The foregoing merely illustrates the principles of the invention. It will thus be appreciated that those skilled in the art will be able to devise various arrangements which, although not explicitly described or shown herein, embody the principles of the invention and are thus within the spirit and scope of the following claims.

We claim:
1. A level shifter comprising:
a driver circuit that is configured to provide a first current and an equal and opposite second current from a first set of supply voltage potentials, and
a driven circuit, operably coupled to the driver circuit, that is configured to provide an output signal corresponding to a second set of supply voltage potentials,
wherein
the first set of supply voltage potentials are substantially independent of the second set of supply voltage potentials
the driven circuit includes:
a first resistor tough which the first current flows between a first voltage source of the second set of supply voltage potentials and the driver circuit, and
a second resistor through which the second current flows between a second voltage source of the second set of supply voltage potentials and the driver circuit; and,
a state of the output signal is dependent upon voltage drops across the first and second resistors.
2. The level shifter of claim 1, further including
a weak current source that is configured to control the state of the output signal when the voltage drops are below a given threshold level.
3. A level shifter comprising:
a driver circuit comprising a pair of current mirrors providing a first current and an equal and opposite second current from a first set of supply voltage potentials, and
a driven circuit, operably coupled to the driver circuit, that is configured to provide an output signal corresponding to a second set of supply voltage potentials,
a voltage controlled current source that provides a controlled input current to the pair of current mirrors;
wherein
the first set of supply voltage potentials are substantially independent of the second set of supply voltage potentials.
4. The level shifter of claim 3, further including
a bias current source that provides a bias input current to the pair of current mirrors.
5. A level shifter comprising:
a driver circuit that is configured to provide a first current and an equal and opposite second current from a fist set of supply voltage potentials, the first and second currents being provided in dependence upon a state of an input signal, and
a driven circuit, operably coupled to the driver circuit, that is configured to provide an output signal corresponding to a second set of supply voltage potentials,
wherein
the first set of supply voltage potentials are substantially independent of the second set of supply voltage potentials
the driver circuit provides
a bias current during a first state of the input signal, and
a drive current that is substantially larger than the bias current during a second state of the input signal.
6. A level shifter comprising:
a driver cut that is configured to provide a first current and an equal and opposite second current from a first set of supply voltage potentials, and
a driven circuit, operably coupled to the driver circuit, that is configured to provide an output signal coresponding to a second set of supply voltage potentials,
wherein
the fist set of supply voltage potentials are substantially independent of the second set of supply voltage potentials,
wherein
the driven circuit includes:
a current mirror and
at least one current source; and,
a state of the output signal is dependent upon current flows through the current mirror and the at least one current source.
7. A level shifter circuit for coupling a first system having a first pair of voltage supply potentials with a second system having a second pair of voltage supply potentials, comprising:

a driver circuit comprising:
  a first current mirror that provides a first current to the second system, and
  a second current mirror that draws a second current from the second system,
  the second current being substantially equal in magnitude to the first current; and
a driven circuit comprising:
  one or more current sources that are configured to selectively couple an output signal to either voltage supply of the second pair of voltage supply potentials in dependence upon the magnitude of the first and second currents.

8. The level shifter circuit of claim 7, wherein
the first current mirror includes
  a first p-channel device having
    a source that is coupled to a first voltage supply of the first pair of voltage supply potentials,
    a drain that is coupled to a first terminal of a controllable current source, and
    a gate that is coupled to the drain of the first p-channel device; a second p-channel device having
      a source that is coupled to the first voltage supply of the first pair of voltage supply potentials,
      a drain that is configured to provide the first current, and
      a gate that is coupled to the gate of the first p-channel device;
the second current mirror includes
  a first n-channel device having
    a source that is coupled to a second voltage supply of the first pair of voltage supply potentials,
    a drain that is coupled to a second terminal of the controllable current source, and
    a gate that is coupled to the drain of the first n-channel device;
  a second n-channel device having
    a source that is coupled to the second voltage supply of the first pair of voltage supply potentials,
    a drain that is configured to draw the second current, and
    a gate that is coupled to the gate of the first n-channel device.

9. The level shifter circuit of claim 8, further including
the controllable current source, and
wherein
the controllable current source includes:
  a bias current source, and
  a drive current source that is controllably coupled to the bias current source based on an input signal.

10. The level shifter circuit of claim 8, further including:
a first diode that is coupled to the drain of the second p-channel device, and
a second diode that is coupled to the drain of the second n-channel device.

11. The level shifter circuit of claim 8, wherein
the driven circuit includes
  a first resistor that is coupled between a first voltage supply of the second pair of voltage supply potentials and a first node,
  a third p-channel device having
    a source that is coupled to the first node,
    a drain that is coupled to a second node, and
    a gate that is coupled to a third node;
  a second resistor that is coupled between the first voltage supply of the second pair of voltage supply potentials and a fourth node,
  a fourth p-channel device having
    a source that is coupled to the fourth node,
    a drain that is coupled to a fifth node, and
    a gate that is coupled to the third node;
  a third resistor that is coupled between a second voltage supply of the second pair of voltage supply potentials and a sixth node,
  a third n-channel device having
    a source that is coupled to the sixth node,
    a drain that is coupled to the second node, and
    a gate that is coupled to the second node;
  a fourth resistor that is coupled between the second voltage supply of the second pair of voltage supply potentials and a seventh node,
  a fourth n-channel device having
    a source that is coupled to the seventh node,
    a drain that is coupled to the fifth node, and
    a gate that is coupled to the second node; and
wherein:
  the first current is provided to the seventh node,
  the second current is drawn from the first node, and
  the fifth node corresponds to the output signal.

12. The level shifter circuit of claim 11, wherein
the driven circuit further includes
  a bias potential source that is configured to bias the gates of the third and fourth p-channel devices.

13. The level shifter circuit of claim 11, wherein
the driven circuit further includes
  a weak current source having
    a first terminal that is connected to the fifth node, and
    a second terminal that is connected to the second voltage supply of the second pair of voltage supply potentials.

* * * * *